United States Patent
Le et al.

[19]

[11] Patent Number: 5,939,928
[45] Date of Patent: Aug. 17, 1999

[54] FAST HIGH VOLTAGE NMOS PASS GATE FOR INTEGRATED CIRCUIT WITH HIGH VOLTAGE GENERATOR

[75] Inventors: Binh Quang Le, Santa Clara; Pau-Ling Chen, Saratoga; Shane Charles Hollmer, San Jose, all of Calif.

[73] Assignee: Advanced Micro Devices, Inc., Sunnyvale, Calif.

[21] Appl. No.: 08/914,196

[22] Filed: Aug. 19, 1997

[51] Int. Cl.[6] .................................................. H03K 17/16
[52] U.S. Cl. .......................... 327/390; 327/434; 327/589
[58] Field of Search .................................... 327/389, 390, 327/391, 427, 434, 536, 589, 437

[56] References Cited

U.S. PATENT DOCUMENTS

| | | | |
|---|---|---|---|
| 5,369,320 | 11/1994 | Satani et al. | 327/390 |
| 5,757,228 | 5/1998 | Furutani et al. | 327/589 |
| 5,812,015 | 9/1998 | Tobita | 327/589 |
| 5,831,470 | 11/1998 | Park et al. | 327/589 |

*Primary Examiner*—Toan Tran
*Assistant Examiner*—Jung Ho Kim
*Attorney, Agent, or Firm*—Fliesler, Dubb, Meyer & Lovejoy

[57] ABSTRACT

In a high voltage pass gate suitable for use as a block decoder in a flash memory circuit, the boosting of the block decoder's internal nodes is performed using coupling capacitors and boost transistors which are decoupled from the high capacitance pass gate node. The block decoder uses three internal block decoder nodes. Each of the three nodes is held to ground by a corresponding discharge transistor when the block is unselected. Each of the three nodes of a selected block is discharged to a normal supply voltage by a corresponding diode-connected regulation transistor when the high voltage supply is turned off after a programming operation has finished. Each of the three nodes has a separate coupling capacitor associated with it. One of the nodes is connected to the gates of the high voltage pass transistors, this node has high capacitance. The remaining two nodes have relatively small coupling capacitors. These other two nodes are capacitively coupling during opposite phases of a clock, and one of them controls a boost transistor which charges the high capacitance pass gate node. Two embodiments are presented, one having one less transistor than the other.

25 Claims, 6 Drawing Sheets

FAST HIGH VOLTAGE NMOS PASS GATE FOR INTEGRATED CIRCUIT WITH HIGH VOLTAGE GENERATOR

BACKGROUND OF THE INVENTION

1. Field of the Invention

The present invention relates to the field of high voltage pass gates in integrated circuits which generate the high voltage internally from a lower positive supply voltage. Specifically, the present invention relates to NMOS implementations of high voltage pass gates which exist for programming and erasing flash non-volatile memory devices.

2. Discussion of the Related Art

In flash memory integrated circuits, high voltages are generated on the chip for programming purposes. These high voltages (around 20V) are much higher than the highest supply voltage (around 3V), and are typically produced by large charge pumps. Because these charge pumps consume power and circuit area, it is desirable to minimize the total capacitance that these high voltage generators drive.

In most CMOS integrated circuits, PMOS transistors are used to pass the higher supply voltages, while NMOS transistors are used to pass the lower supply voltages. For example, PMOS transistors are used to implement pull up circuits, while NMOS transistors are used to implement pull down circuits. However, PMOS transistor subcircuits in a CMOS integrated circuit must be electrically isolated in an N-type well which must be biased at or above the same high voltage to guarantee that the P/N junction formed by the P-type drain/source regions of the PMOS transistors and the N-type well are not forward biased. If PMOS transistors are used in the high-voltage subcircuits, these N-type isolation wells constitute a very large capacitance for the on-chip high voltage generator to drive. Therefore, in high-voltage subcircuits supplied by on-chip high-voltage generators, the use of NMOS transistors is typically preferable to the use of PMOS transistors.

However, the voltage which can be passed by an NMOS transistor is limited by the transistor's threshold voltage Vt. If a gate voltage Vg is applied to an NMOS transistor's gate, then the maximum voltage which can be passed from source to drain is Vg-Vt. If the voltage generator produces a maximum voltage Vpp (about 20V), it is desirable for transistors passing or switching that high voltage to pass Vpp without incurring the threshold voltage drop. In other words, the pass transistors should pass Vpp rather than Vpp-Vt. Therefore, in order to pass a high voltage Vpp through an NMOS device, its gate must be boosted to a voltage higher than the high voltage by at least one threshold voltage Vt, so that Vpp+Vt must be applied to the gate of the NMOS pass transistor.

In a flash memory chip, the word lines of each block are controlled by a block decoder having NMOS pass gates which selectively pass the high programming voltage Vpp to one or more of the words in the block. A flash memory chip may have thousands of blocks, and therefore may have thousands of block decoders.

FIG. 1 illustrates a block decoder having a high voltage pass gate which is the subject of U.S. patent application Ser. No. 08/808,237, filed Feb. 28, 1997, and entitled "High Voltage NMOS Pass Gate For Integrated Circuit With High Voltage Generator", which is incorporated herein by reference in its entirely. CLK typically oscillates between ground and the positive supply voltage, which can be as low or lower than three volts. When CLK makes a transition from low to high, the voltage at node B correspondingly increases by Vcc*C1/(C1+CB), in which CB is the capacitance at node B. The capacitance at node B, CB, is the sum of the gate capacitance of transistors M1 and M5, the source of transistor M2, the drain of transistor M7, and the gate and drain capacitance of transistor M3, as well as the various routing capacitance associated with the wires connecting the various transistor elements connected to node B.

Discharge transistors M6 and M7 prevent nodes A and B from rising if the block is not selected by virtue of the DECODE signal being held to ground. Regulation transistors M3 and M4 discharge the nodes A and B when the high voltage Vpp is turned off at the end of a programming cycle.

Transistor M5 is typically large because it drives a high capacitance word line of a memory array. In the case of a NAND type flash memory array, the gates of several pass transistors may be connected to node B, as illustrated in FIG. 2, in which eight word lines wL0 through wL7 are connected by eight pass transistors M50 through M57 to eight potentially high voltage nodes xT0 through xT7, respectively. In this case, the capacitance CB on node B may be very large. The capacitance CB can be ten times larger than the gate capacitance of any of the transistors M1–M4.

Therefore, a need exists for a high voltage pass gate which is able to function as a block decoder in a NAND type flash memory circuit having high capacitance pass gate nodes. Because it is replicated many times on an integrated circuit, the block decoder circuit must not be overly large, and must provide acceptable output node rise times.

SUMMARY OF THE INVENTION

Previous block decoder circuits, although very useful in different circuit environments, either require extraordinarily large coupling capacitors or incur unacceptably large word line rise times when applied in the environment of high capacitance pass gate structures such as found in modern NAND-type flash memory circuits. Therefore, an object of the present invention is to provide a circuit structure which can pass high voltage to a large capacitance output node with little latency.

According to the present invention, the boosting of the block decoder's internal nodes is performed using coupling capacitors and boost transistors which are decoupled from the high capacitance pass gate node. Because the boosting elements are not coupled to the high capacitance pass gate node, a higher coupling ratio can be achieved with a smaller coupling capacitor, thereby reducing coupling capacitor area and increasing the amount of output voltage increase per clock cycle. The present invention uses three internal block decoder nodes. Each of the three nodes is held to ground by a corresponding discharge transistor when the block is unselected. Each of the three nodes of a selected block is discharged to a normal supply voltage by a corresponding diode-connected regulation transistor when the high voltage supply is turned off after a programming operation has finished. Each of the three nodes has a separate coupling capacitor associated with it. One of the nodes is connected to the gates of the high voltage pass transistors, this node has high capacitance; the coupling capacitor associated with this node is only relied upon to couple this node during when the word line is within one threshold voltage of its final value. The remaining two nodes have relatively small coupling capacitors and yet still achieve a high coupling ratio because they are not coupled to the high capacitance pass gate node. These other two nodes are capacitively coupling during opposite phases of a clock, and one of them controls a boost transistor which charges the high capacitance pass gate node. Two embodiments are presented, one having one less transistor than the other.

These and other features of the present invention will be apparent from the Figures as fully explained in the Detailed Description of the Invention.

Figure 1:
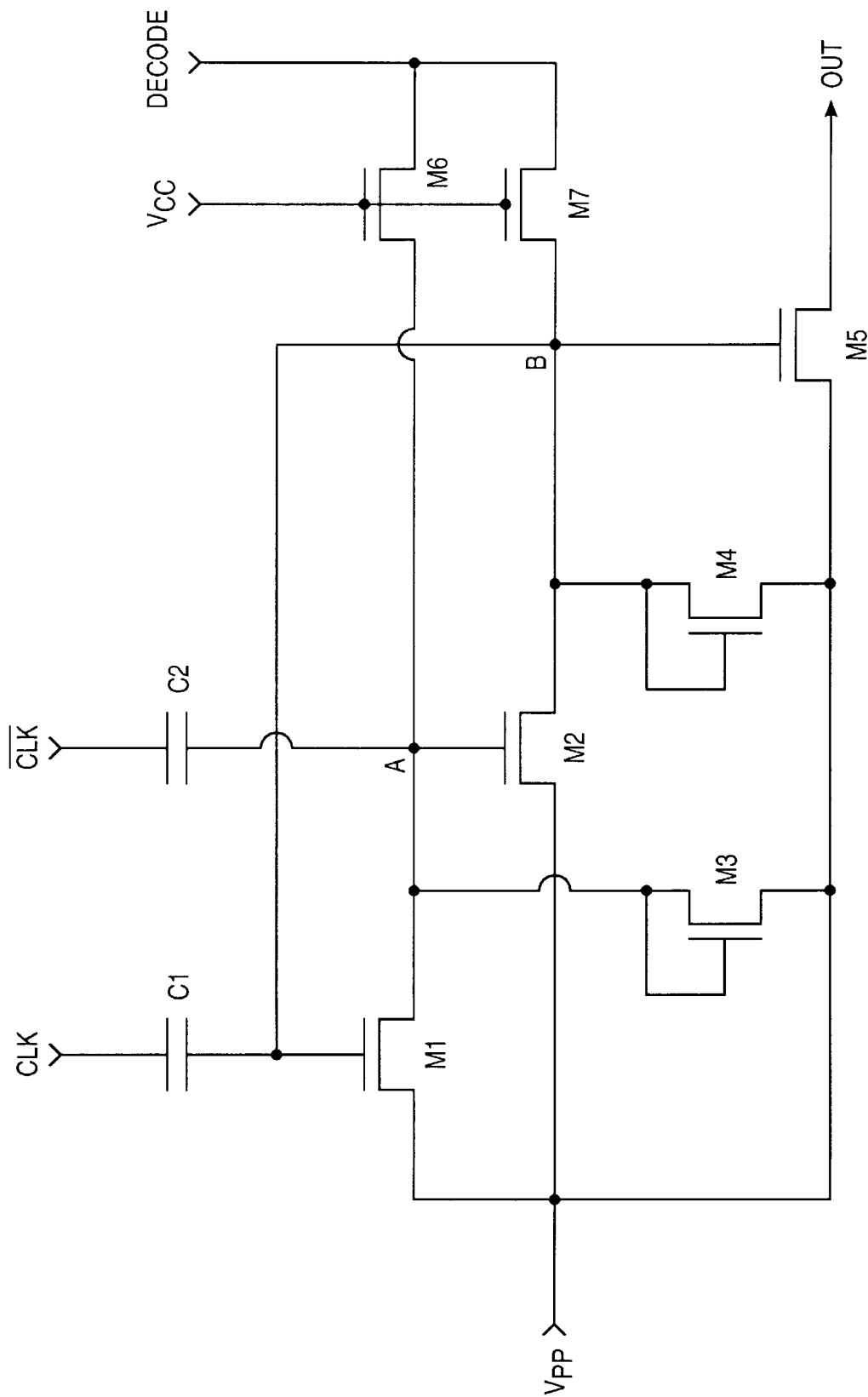
FIG. 1 illustrates a high voltage pass gate previously used by the inventors of the present invention as a block decoder of a flash type memory in which the pass gate capacitances were lower than in the environment of the block decoders according to the present invention.

The Figures are more thoroughly explained in the Detailed Description of the Invention.

DETAILED DESCRIPTION OF THE INVENTION

Previous block decoder circuits in flash memory, although they were very useful in many different applications, required either very large coupling capacitors or had slow word line rise times when applied to high capacitance flash memory pass gates.

When the high voltage charge pumps are turned on, the voltage Vpp increases approximately linearly over a substantial period of time, due to the limited capacity of the charge pumps and the typically high capacitance of the internal high voltage nodes which must be charged. Ideally, nodes A and B in the block decoder of a selected block and the word lines OUT or wL0–wL7 in the selected block should be able to keep up with Vpp as Vpp rises in voltage. If nodes A, B, or OUT fall substantially behind the increasing Vpp, then additional latency is undesirably introduced into the charging of the word lines in the selected block.

Upon the rising edge of CLK, pass transistor M5 and the boost transistor M1 are turned ON to the extent that Vcc*C1/(C1+CB) is greater than the threshold voltage Vt. In order for the circuit to work at all at any speed, the coupling capacitor C1 must be greater than Vt*CB/(Vcc−Vt). Therefore, as the supply voltage Vcc decreases, C1 must increase, and as Vt increases due to the body effect as the transistors are boosted to higher voltages, C1 must also increase. Although Vcc*C1/(C1+CB)>Vt must be satisfied for the circuit to work correctly even at slow speeds, node B must be coupled up to a voltage substantially higher than Vt in order for transistor M5 to be turned ON with enough strength to allow the word line OUT to rise in voltage with acceptable speed.

The coupling ratio R is C1/(C1+CB). Node B is coupled up to R*Vcc at the rising edge of CLK. If R is around ⅔, then node B is coupled up to two-thirds the supply voltage at the rising edge of CLK. However, the coupling capacitor C1 must equal CB*R/(1−R) in order to achieve any given coupling ratio R. Thus, to achieve a coupling ratio of two-thirds, the coupling capacitor C1 must be twice as large as CB. Any coupling ratio R higher than one-half requires that the coupling capacitor C1 be larger than CB. To achieve a coupling ratio R of 0.9, C1 is nine times CB. As the coupling ratio R approaches 1, the coupling capacitance C1 size approaches infinite.

Therefore, a practical limit exists to the size of the coupling ratio R. Because the circuit is replicated many thousands of times on a memory chip, in order to conserve circuit area, the ratio R is limited to about 0.7. However, in NAND type flash memory, the capacitance at node B is very large due to the large number of pass transistors M50–M57. Because Vcc*0.7 does not turn transistors M50–M57 ON hard enough, the high capacitance output node OUT or wL0–wL7 will not be driven quickly enough. Typically, Vpp increases as the high voltage charge pumps are turned on. Ideally, it is desirable for M50–M57 to be turned ON hard enough that the increase in voltage at the word lines will keep pace with Vpp. However, if this is not possible, it is at least desirable for the internal nodes A and B to keep pace with Vpp as it increases. However, if the coupling ratio is too low, then node A begins to lag behind the high voltage Vpp because transistor M1 is not turned ON hard enough. When node A lags behind Vpp, it causes node B to lag behind Vpp. When node B lags behind Vpp, it causes the word line OUT or wL0–wL7 to lag even further behind, thereby introducing undesired latency into the programming operation.

As is apparent from the above discussion, a need exists for a high voltage pass gate suitable for use as a block decoder circuit in a flash memory that does not require extraordinarily large coupling capacitors and yet is nonetheless able to charge high capacitance word lines with minimal latency.

Figure 3:
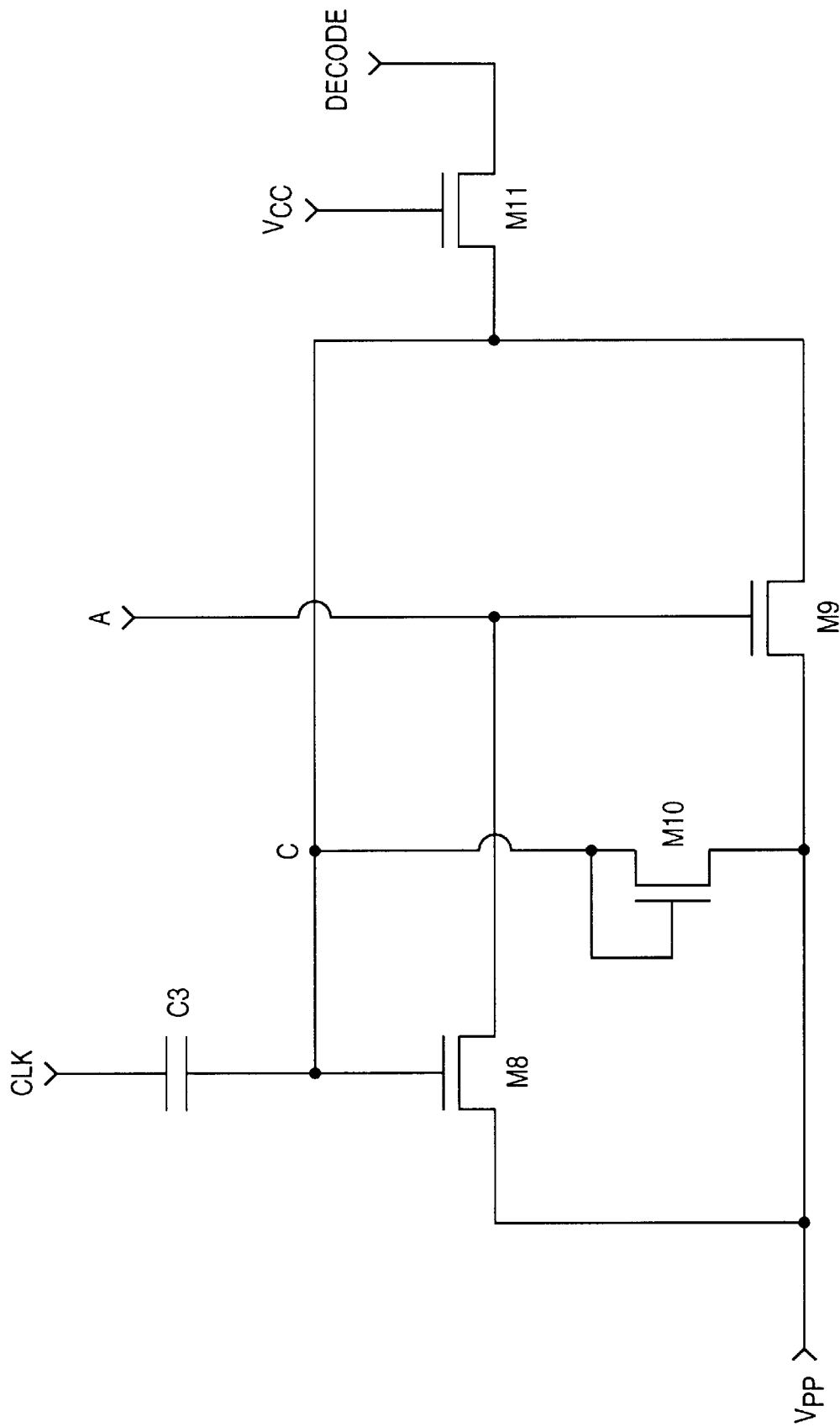
FIG. 3 illustrates additional circuit elements according to the present invention which enhance the performance of the circuit shown in FIG. 1.

According to the present invention as illustrated in FIG. 3, node A is charged through another decoupled boost transistor M8 which is not coupled to the large capacitance pass gate node B. The coupling ratio for the decoupled boost transistor M8 is C3/(C3+CC), in which CC is the capacitance at node C. The capacitance CC at node C is the sum of the gate capacitance of decoupled boost transistor M8, the gate and drain of regulation transistor M10, the source of decoupled boost transistor M9, and the drain of discharge transistor M11, as well as various routing capacitances. Even using a relatively small coupling capacitor C3 that is smaller than C1 or C2, the capacitance CC is still relatively small compared to C3, so that the coupling ratio C3/(C3+CC) is relatively high as it is greater than 0.8.

The discharge transistor M11 prevents node C from rising if the block is unselected by virtue of the DECODE signal being held low at ground. Regulation transistor M10 allows node C to discharge when the high voltage generator is turned off and Vpp decreases down to a normal supply voltage level at the end of a programming cycle.

When CLK goes high, the voltage at node C is increased by Vcc*C3/(C3+CC). Decoupled boost transistor M8 charges node A up to Vpp, and this allows node B to be charged to Vpp through boost transistor M2 on the rising edge of /CLK. Therefore, all nodes A, B, and OUT are able to track Vpp as it increases.

Figure 2:
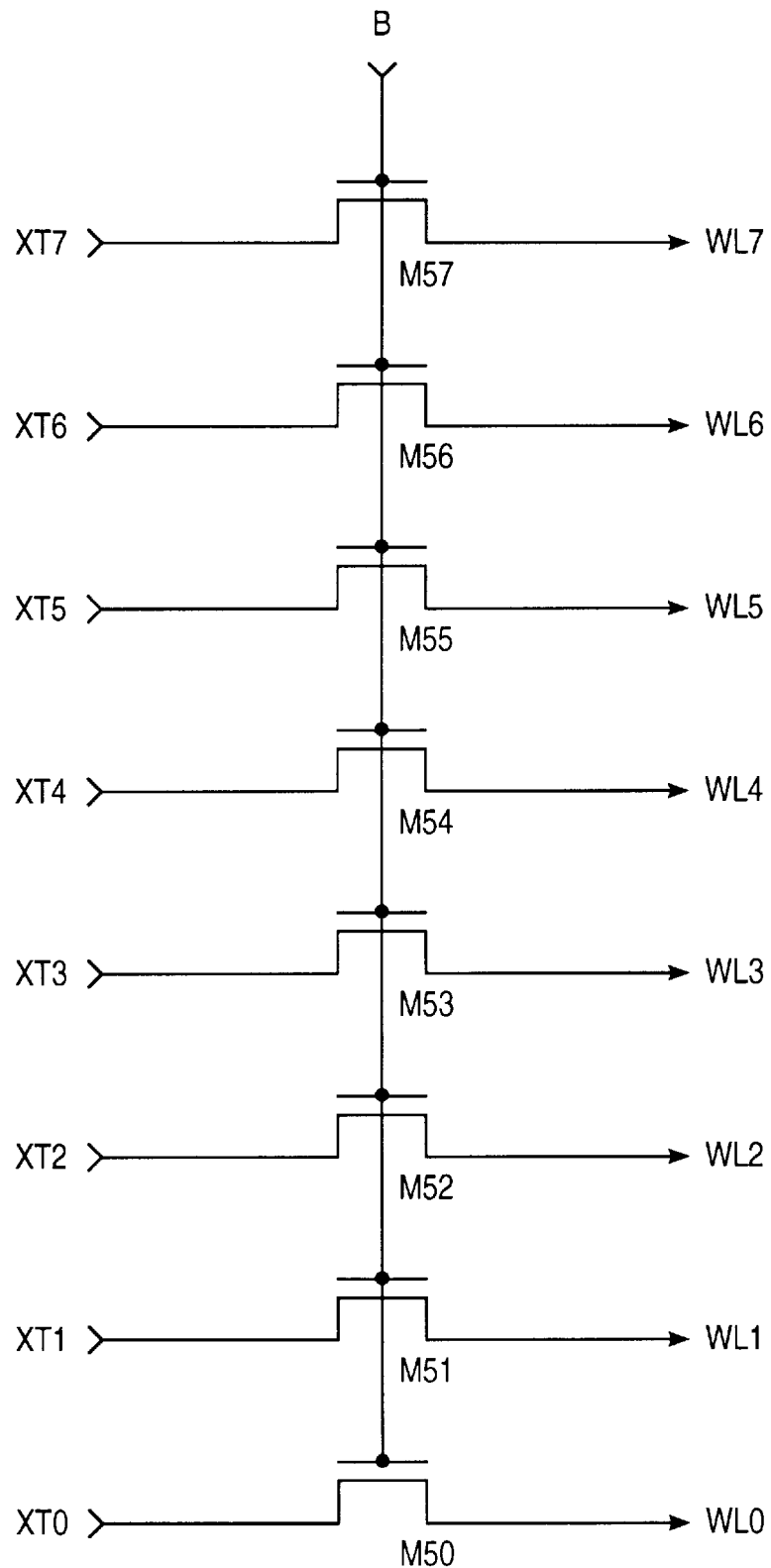
FIG. 2 illustrates pass transistors for an eight-word block suitable for use with the circuits according to the present invention.
Figure 4:
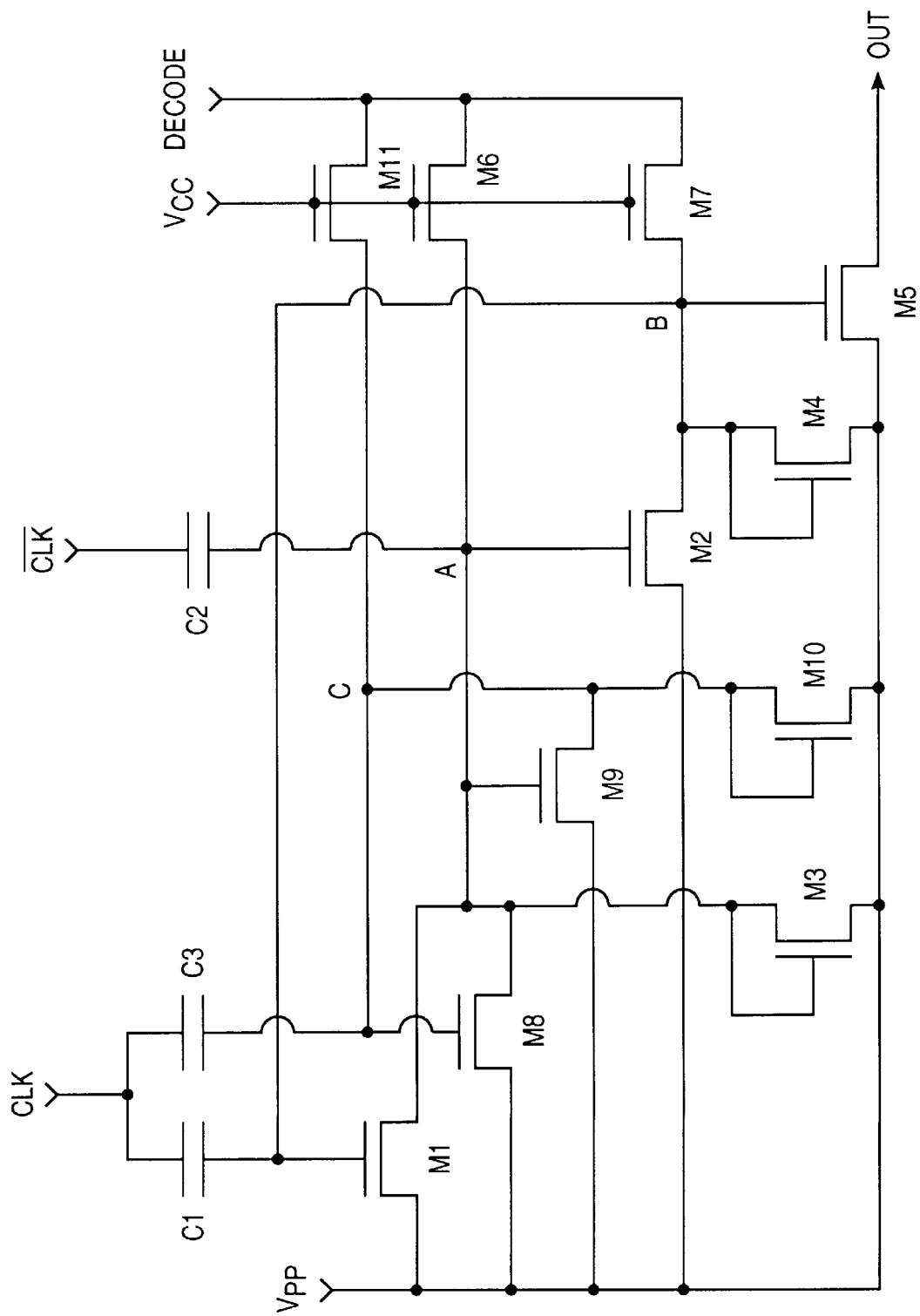
FIG. 4 illustrates an embodiment of a block decoder circuit according to the present invention, and represents a composite of FIGS. 1 and 3.

FIG. 4 is an integrated illustration of FIGS. 2 and 3, showing an embodiment of the circuit according to the present invention. Boost transistor M1 and decoupled boost transistor M8 each connect the high voltage node Vpp to node A on the rising edge of CLK because they have the same drain and source connections. However, the gate of decoupled boost transistor M8 is coupled to node C while the gate of boost transistor M1 is coupled to node B. Both nodes B and C are charged to the same voltage by boost transistor M2 and decoupled boost transistor M9, respectively, on the rising edge of /CLK because boost transistor M2 and decoupled boost transistor M9 each have the same gate and drain connections; the gates of M2 and M9 are connected to node A while the drains are connected to Vpp. However, on the rising edge of CLK, node B is increased by Vcc*C1/(C1+CB) while node C is increased by Vcc*C3/(C3+CC). Because C1/(C1+CB) is less than C3/(C3+CC), transistor M1 is not as effective as transistor M8 at connecting node A to Vpp. Therefore, in another embodiment of the present invention, transistor M1 is eliminated entirely without adversely affecting the operation of the circuit.

Figure 5:
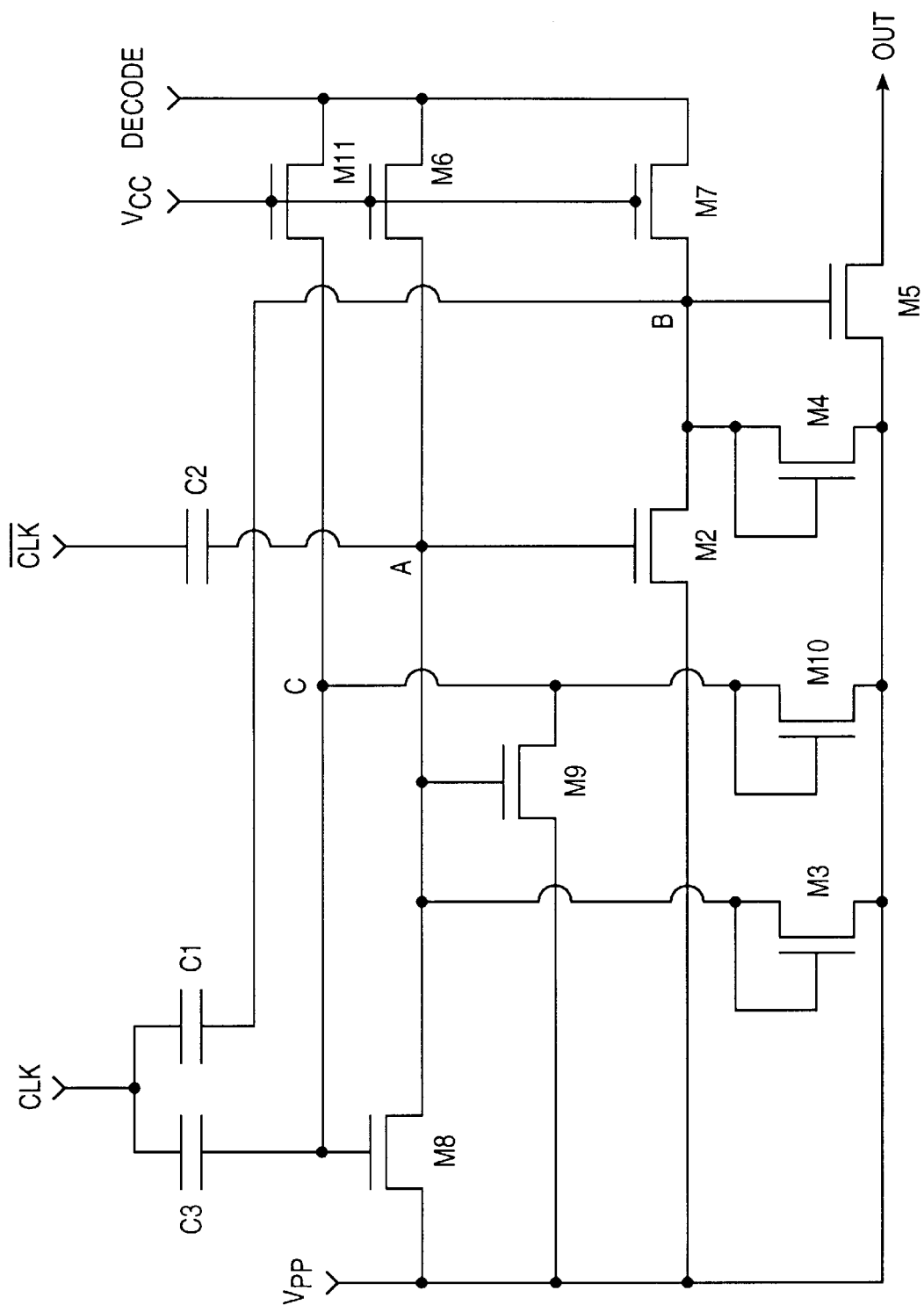
FIG. 5 illustrates another embodiment of the block decoder circuit according to the present invention.

FIG. 5 illustrates another embodiment of the present invention in which transistor M1 is eliminated. The elimination of transistor M1 reduces the capacitance CB on node B, thereby increasing slightly the coupling ratio C1/(C1+CB), and thus allowing the word line OUT to track Vpp a little more closely.

Figure 6:
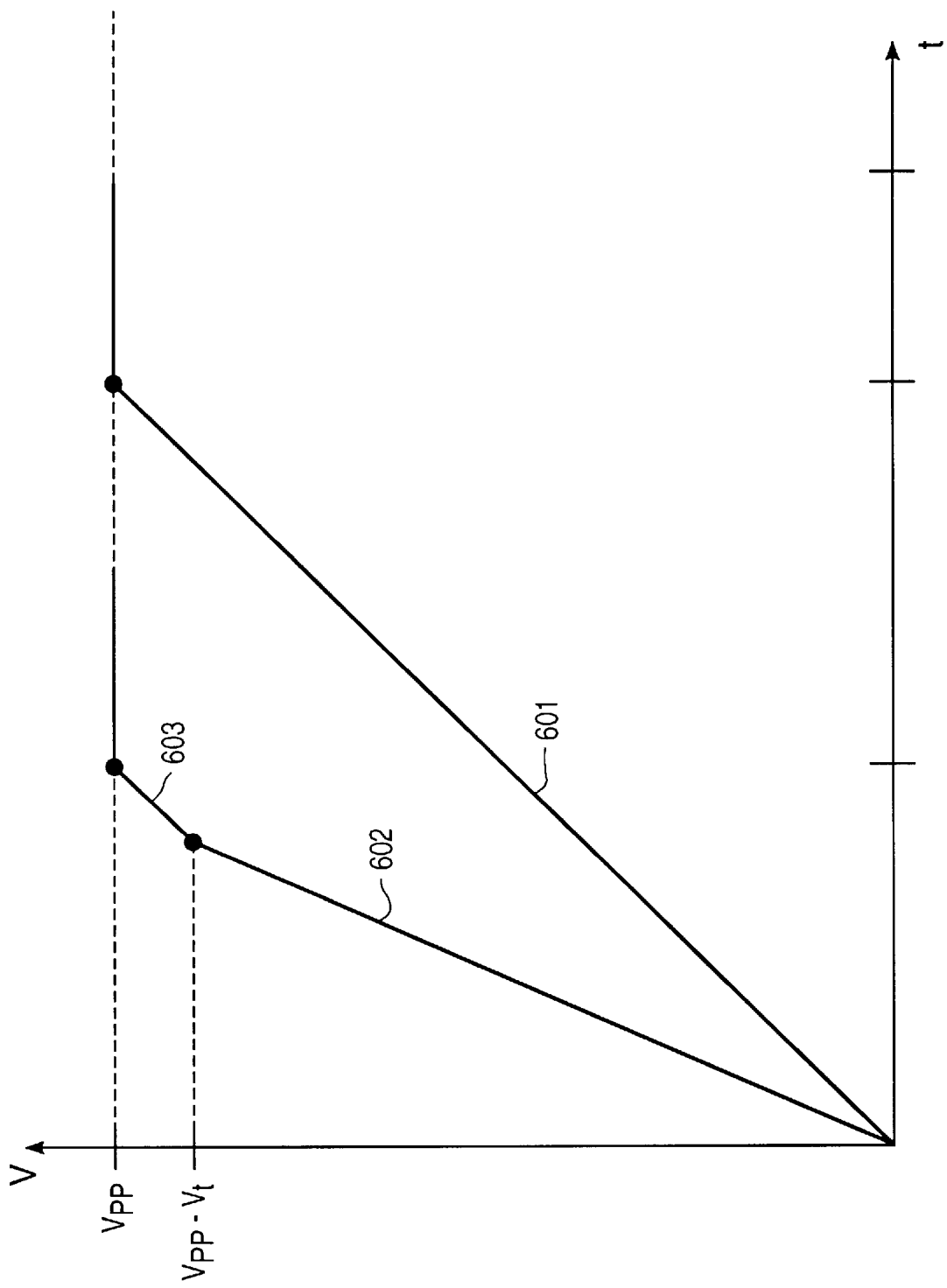
FIG. 6 is a voltage versus time plot showing the voltage of a word line during a programming operation using the block decoder circuit shown in FIG. 1 and the block decoder circuit according to the present invention shown in FIG. 5.

FIG. 6 illustrates the increase in voltage at the output nodes OUT for the block decoder circuits of FIGS. 1 and 5. The trace 601 illustrates the rate of increase in the output node OUT for the block decoder circuit shown in FIG. 1; the traces 602 and 603 illustrate the rates of increase in the output node OUT for the block decoder circuit according to the present invention shown in FIG. 5.

FIG. 6 shows the general shape of the output waveforms, although it does not show small variations that occur in the output waveforms as a result of the cycling of the clocks CLK and /CLK. The waveforms of FIG. 6 also assume that the block decoder circuits themselves are the limiting factor in the increase of the output voltage OUT. As discussed above, typically the high voltage Vpp is being generated by a charge pump, so that during a programming operation, Vpp increases up to its final value of around 20 volts over a significant period of time.

If the rate of increase of Vpp is less than the slope of the trace 601 corresponding to the circuit of FIG. 1, then both of the circuits illustrated in FIGS. 1 and 5 will be able to keep pace with Vpp and reach the final desired voltage at the word line outputs OUT in approximately the same time.

However, if the rate of increase in voltage of Vpp is higher than the slope of trace 601 but is less than the slope of trace 602, then the circuit of FIG. 1 will limit the rise time of the word line OUT as the block decoder circuit illustrated in FIG. 1 is unable to keep pace with the increase in Vpp. In this case, the block decoder of FIG. 5 will keep pace with Vpp while the block decoder circuit of FIG. 1 will fall behind Vpp.

The voltage traces shown in FIG. 6 assume that the rate of increase of Vpp is higher than the positively sloping portions of the traces at all times. In other words, Vpp is higher than either of the traces at any given time. Therefore, FIG. 6 illustrates that if the block decoder latency is in the critical path during a programming operation, the block decoder of FIG. 5 will perform better than the block decoder of FIG. 1.

Thus, the rate of increase of the output voltage OUT may be constrained either by the rate of increase of Vpp from the charge pump or, alternatively, by the ability of the block decoder internal nodes A, B, and C to increase through capacitive coupling with the cycling of the clocks CLK and /CLK. In the latter case in which the block decoder rather than the global Vpp charge pump is the limiting element, if the circuit is designed and operated properly so that the high times of CLK and /CLK are long enough, a complete charge transfer from Vpp to the internal nodes A, B, and C through the boost transistors can occur during the high portion of each phase of the clock. In other words, each respective internal node A, B, or C is charged to one threshold voltage below the respective boost transistor's gate voltage. During the high phase of CLK, node A is charged through M8. During the high phase of /CLK, node B is charged through M2, and node C is charged through M9. In this case, during the high and low phases of the nth clock cycle, the voltages at each of the internal nodes A, B, and C are given by the following equations.

In the following equations (1) through (8), each node voltage is expressed as the voltage during clock cycle n during either the high or low phase of the clock. For example, VC[n,high] represents the node voltage at node C during the high phase of the nth clock cycle. Each node voltage is a function either of another node voltage at the same time (same clock period and clock phase) or a node voltage at the immediately preceding clock phase. Each clock period is defined to begin with its high phase and end with its low phase. Thus, [n−1,low] is the immediately preceding clock phase for [n,high], but [n,high] is the immediately preceding clock phase for [n,low].

(1) VC[n,high]=VC[n−1,low]+Vcc*C3/(C3+CC)

(2) VB[n,high]=VB[n−1,low]+Vcc*C1/(C1+CB)

(3) VA[n,high]=minimum {VC[n,high]−Vt , Vpp}

(4) OUT[n,high]=minimum {VB[n,high]−Vt, Vpp}

(5) VA[n,low]=VA[n,high]+Vcc*C2/(C2+CA)

(6) VC[n,low]=minimum {VA[n,low]−Vt, Vpp}

(7) VB[n,low]=minimum {VA[n,low]−Vt, Vpp}

(8) OUT[n,low]=OUT[n,high]

Equations (3), (4), (6), and (7) include "minimum" functions which indicate that the designated nodes cannot rise higher than Vpp at the designated times. Because of the high capacitive coupling ratio at node C, transistor M8 charges node A quickly during the high phase of CLK. Because node A is quickly charged by transistor M8, transistor M2 is able to charge node B quickly during the high phase of /CLK. Because node B is quickly charged by transistor M2, transistor MS is able to charge the output node OUT quickly during the high phase of CLK.

It is apparent from the above expressions that the internal nodes are boosted only the amount by which the coupling ratio times the supply voltage exceeds the transistor's threshold voltage. Therefore, a slight increase in the coupling ratio can result in a large increase in the charging rate at the output. Typically the word lines OUT or wL0–wL7 are very highly capacitive, and transistor MS or M50 through M57 cannot be made large enough for the voltage at the word lines to keep pace with Vpp as Vpp rises. In this case, then the increase in the rate of output voltage change is especially large, because transistor MS will be operating in saturation, in which there is a quadratic relationship between gate-to-source voltage and drain current.

As illustrated by the trace 603 in FIG. 6, when the output voltage OUT comes within one threshold voltage of the final value of Vpp, then the rate of increase in the output OUT declines. The slope of the trace 603 according to the present invention at the end of the charging of the output OUT is equal to the slope of the trace 601 corresponding to FIG. 1. When transistor M2 has fully charged node B to Vpp, the advantages of the higher coupling ratio introduced by C3 and transistors M8 through M11 are no longer realizable. At this point, the output OUT increases only during the high phase of CLK and as a result of the capacitive coupling through C1. In order for the output voltage OUT to reach its final value of Vpp, it is still necessary for Vcc*C1/(C1+CB) to exceed the threshold voltage Vt of M5.

Although the present invention has been described with reference to its preferred and alternative embodiments, those embodiments are offered by way of example, not by way of limitation. Those skilled in the field of art of the present invention will be enabled by this disclosure to make various additions and modifications to the embodiments disclosed herein. Accordingly, such additions and modifications are deemed to lie within the spirit and scope of the invention as set out in the appended claims.

What is claimed is:

1. A high voltage switch having an input and an output, comprising:
    a first NMOS boost transistor having a source, a drain, and a gate;
    a first coupling capacitor having first and second terminals;
    a second coupling capacitor having first and second terminals;
    an NMOS pass transistor having a source, a drain, and a gate;
    a first NMOS discharge transistor having a source, a drain, and a gate;
    a second NMOS discharge transistor having a source, a drain, and a gate;
    a first decoupled NMOS boost transistor having a source, a drain, and a gate;
    a second decoupled NMOS boost transistor having a source, a drain, and a gate;
    a third coupling capacitor having first and second terminals; and
    a third NMOS discharge transistor having a source, a drain, and a gate;
    wherein the first NMOS boost transistor gate is connected to the second coupling capacitor second terminal;
    wherein the first NMOS boost transistor drain is connected to the first coupling capacitor second terminal and the pass transistor gate;
    wherein the high voltage switch input is coupled to the NMOS pass transistor source and the first NMOS boost transistor source;
    wherein the first coupling capacitor first terminal is connected to a first clock input, and the second coupling capacitor first terminal is connected to a second clock input;
    wherein the NMOS pass transistor drain is connected to the high voltage switch output;
    wherein the first NMOS discharge transistor source is connected to the first NMOS boost transistor gate;
    wherein the second NMOS discharge transistor source is connected to the first NMOS boost transistor drain;
    wherein the first decoupled NMOS boost transistor drain is connected to the second decoupled NMOS boost transistor gate and the first NMOS boost transistor gate;
    wherein the second decoupled NMOS boost transistor drain is connected to the first decoupled NMOS boost transistor gate and the third coupling capacitor second terminal;
    wherein the high voltage switch input is coupled to the first decoupled NMOS boost transistor source and the second decoupled NMOS boost transistor source;
    wherein the third coupling capacitor first terminal is connected to the first clock input; and
    wherein the third NMOS discharge transistor source is connected to the second decoupled NMOS boost transistor drain.

2. A high voltage switch as in claim 1,
    wherein the first NMOS discharge transistor drain, the second NMOS discharge transistor drain, and the third NMOS discharge transistor drain are connected to a decode input.

3. A high voltage switch as in claim 2,
    wherein the first NMOS discharge transistor gate, the second NMOS discharge transistor gate, and the third NMOS discharge transistor gate are connected to a positive power supply.

4. A high voltage switch as in claim 3,
    wherein the first clock input and the second clock input are never simultaneously asserted.

5. A high voltage switch as in claim 4,
    wherein the second clock input is a logical inverse of the first clock input.

6. A high voltage switch as in claim 5, further comprising:
    a two-input NAND gate having the decode input and an oscillator signal as inputs;
    wherein the two-input NAND gate produces the second clock as output.

7. A high voltage switch as in claim 1, further comprising:
    a second NMOS boost transistor having a source, a drain, and a gate;
    wherein the second NMOS boost transistor drain is connected to the first NMOS boost transistor gate and the second coupling capacitor second terminal;
    wherein the first NMOS boost transistor drain is connected to the second NMOS boost transistor gate, the first coupling capacitor second terminal, and the pass transistor gate;
    wherein the high voltage switch input is coupled to the NMOS pass transistor source, the second NMOS boost transistor source, and the first NMOS boost transistor source;
    wherein the first NMOS discharge transistor source is connected to the second NMOS boost transistor drain;
    wherein the second NMOS discharge transistor source is connected to the first NMOS boost transistor drain; and
    wherein the first decoupled NMOS boost transistor drain is connected to the second decoupled NMOS boost transistor gate and the first NMOS boost transistor gate.

8. A high voltage switch as in claim 5 further comprising:
    an inverter having the second clock as input and producing the first clock as output.

9. A high voltage switch as in claim 1, further comprising:
    one or more parallel NMOS pass transistors having their sources connected to the high voltage supply, having their gates connected to the first NMOS boost transistor drain, and having their drains connected to one or more parallel high voltage switch outputs.

10. A high voltage switch having an input and an output, comprising:

a first NMOS boost transistor having a source, a drain, and a gate;

a first coupling capacitor having first and second terminals;

a second coupling capacitor having first and second terminals;

an NMOS pass transistor having a source, a drain, and a gate;

a first NMOS regulation transistor having a source, a drain, and a gate;

a second NMOS regulation transistor having a source, a drain, and a gate;

a first decoupled NMOS boost transistor having a source, a drain, and a gate;

a second decoupled NMOS boost transistor having a source, a drain, and a gate;

a third coupling capacitor having first and second terminals; and a third NMOS regulation transistor having a source, a drain, and a gate;

wherein the first NMOS boost transistor gate is connected to the second coupling capacitor second terminal;

wherein the first NMOS boost transistor drain is connected to the first coupling capacitor second terminal and the pass transistor gate;

wherein the high voltage switch input is coupled to the NMOS pass transistor source and the first NMOS boost transistor source;

wherein the first coupling capacitor first terminal is connected to a first clock input, and the second coupling capacitor first terminal is connected to a second clock input;

wherein the NMOS pass transistor drain is connected to the high voltage switch output;

wherein the first NMOS regulation transistor source and gate are connected to the first NMOS boost transistor gate;

wherein the second NMOS regulation transistor source and gate are connected to the first NMOS boost transistor drain; and wherein the high voltage switch input is connected to the first NMOS regulation transistor drain and the second NMOS regulation transistor drain;

wherein the first decoupled NMOS boost transistor drain is connected to the second decoupled NMOS boost transistor gate and the first NMOS boost transistor gate;

wherein the second decoupled NMOS boost transistor drain is connected to the first decoupled NMOS boost transistor gate and the third coupling capacitor second terminal;

wherein the high voltage switch input is coupled to the first decoupled NMOS boost transistor source and the second decoupled NMOS boost transistor source;

wherein the third coupling capacitor first terminal is connected to the first clock input; and wherein the third NMOS regulation transistor source and gate are connected to the second decoupled NMOS boost transistor drain.

11. A high voltage switch as in claim 10, wherein the first clock input and the second clock input are never simultaneously asserted.

12. A high voltage switch as in claim 11, wherein the second clock input is a logical inverse of the first clock input.

13. A high voltage switch as in claim 12, further comprising:

a two-input NAND gate having the decode input and an oscillator signal as inputs;

wherein the two-input NAND gate produces the second clock as output.

14. A high voltage switch as in claim 10, further comprising:

a second NMOS boost transistor having a source, a drain, and a gate;

wherein the second NMOS boost transistor drain is connected to the first NMOS boost transistor gate and the second coupling capacitor second terminal;

wherein the first NMOS boost transistor drain is connected to the second NMOS boost transistor gate, the first coupling capacitor second terminal, and the pass transistor gate;

wherein the high voltage switch input is coupled to the NMOS pass transistor source, the second NMOS boost transistor source, and the first NMOS boost transistor source; and wherein the first NMOS regulation transistor source and gate are connected to the second NMOS boost transistor drain.

15. A high voltage switch as in claim 13, further comprising:

an inverter having the second clock as input and producing the first clock as output.

16. A high voltage switch as in claim 10, further comprising:

one or more parallel NMOS pass transistors having their sources connected to the high voltage supply, having their gates connected to the first NMOS boost transistor drain, and having their drains connected to one or more parallel high voltage switch outputs.

17. A high voltage switch having an input and an output, comprising:

a first NMOS boost transistor having a source, a drain, and a gate;

a first coupling capacitor having first and second terminals;

a second coupling capacitor having first and second terminals;

an NMOS pass transistor having a source, a drain, and a gate;

a first NMOS regulation transistor having a source, a drain, and a gate;

a second NMOS regulation transistor having a source, a drain, and a gate;

a first NMOS discharge transistor having a source, a drain, and a gate;

a second NMOS discharge transistor having a source, a drain, and a gate;

a first decoupled NMOS boost transistor having a source, a drain, and a gate;

a second decoupled NMOS boost transistor having a source, a drain, and a gate;

a third coupling capacitor having first and second terminals;

a third NMOS regulation transistor having a source, a drain, and a gate; and a third NMOS discharge transistor having a source, a drain, and a gate;

wherein the first NMOS boost transistor gate is connected to the second coupling capacitor second terminal;

wherein the first NMOS boost transistor drain is connected to the first coupling capacitor second terminal and the pass transistor gate;

wherein the high voltage switch input is coupled to the NMOS pass transistor source and the first NMOS boost transistor source;

wherein the first coupling capacitor first terminal is connected to a first clock input, and the second coupling capacitor first terminal is connected to a second clock input;

wherein the NMOS pass transistor drain is connected to the high voltage switch output;

wherein the first NMOS regulation transistor source and gate are connected to the first NMOS boost transistor gate;

wherein the second NMOS regulation transistor source and gate are connected to the first NMOS boost transistor drain;

wherein the high voltage switch input is connected to the first NMOS regulation transistor drain and the second NMOS regulation transistor drain;

wherein the first NMOS discharge transistor source is connected to the first NMOS boost transistor gate;

wherein the second NMOS discharge transistor source is connected to the first NMOS boost transistor drain;

wherein the first decoupled NMOS boost transistor drain is connected to the second decoupled NMOS boost transistor gate and the first NMOS boost transistor gate;

wherein the second decoupled NMOS boost transistor drain is connected to the first decoupled NMOS boost transistor gate and the third coupling capacitor second terminal;

wherein the high voltage switch input is coupled to the first decoupled NMOS boost transistor source and the second decoupled NMOS boost transistor source;

wherein the third coupling capacitor first terminal is connected to the first clock input;

wherein the third NMOS discharge transistor source is connected to the second decoupled NMOS boost transistor drain; and wherein the third NMOS regulation transistor source and gate are connected to the second decoupled NMOS boost transistor drain.

18. A high voltage switch as in claim 17, wherein the first NMOS discharge transistor drain, the second NMOS discharge transistor drain, and the third NMOS discharge transistor drain are connected to a decode input.

19. A high voltage switch as in claim 18, wherein the first NMOS discharge transistor gate, the second NMOS discharge transistor gate, and the third NMOS discharge transistor gate are connected to a positive power supply.

20. A high voltage switch as in claim 19, wherein the first clock input and the second clock input are never simultaneously asserted.

21. A high voltage switch as in claim 20, wherein the second clock input is a logical inverse of the first clock input.

22. A high voltage switch as in claim 21, further comprising:

a two-input NAND gate having the decode input and an oscillator signal as inputs;

wherein the two-input NAND gate produces the second clock as output.

23. A high voltage switch as in claim 17, further comprising:

a second NMOS boost transistor having a source, a drain, and a gate;

wherein the second NMOS boost transistor drain is connected to the first NMOS boost transistor gate and the second coupling capacitor second terminal;

wherein the first NMOS boost transistor drain-is connected to the second NMOS boost transistor gate, the first coupling capacitor second terminal, and the pass transistor gate;

wherein the high voltage switch input is coupled to the NMOS pass transistor source, the second NMOS boost transistor source, and the first NMOS boost transistor source;

wherein the first NMOS regulation transistor source and gate are connected to the second NMOS boost transistor drain; and wherein the first NMOS discharge transistor source is connected to the second NMOS boost transistor drain.

24. A high voltage switch as in claim 22, further comprising:

an inverter having the second clock as input and producing the first clock as output.

25. A high voltage switch as in claim 17, further comprising:

one or tore parallel NMOS pass transistors having their sources connected to the high voltage supply, having their gates connected to the first NMOS boost transistor drain, and having their drains connected to one or more parallel high voltage switch outputs.

* * * * *

UNITED STATES PATENT AND TRADEMARK OFFICE
CERTIFICATE OF CORRECTION

PATENT NO.   : 5,939,928
DATED        : 8/17/99
INVENTOR(S)  : Le, et al.

It is certified that error appears in the above-identified patent and that said Letters Patent is hereby corrected as shown below:

Column 12, line 47, please delete "tore" and insert
-- more --.

Signed and Sealed this

First Day of February, 2000

Attest:

Attesting Officer

Q. TODD DICKINSON

Acting Commissioner of Patents and Trademarks